Oct. 27, 1959 M. PRESS 2,910,658

HIGH-FREQUENCY WAVE-SIGNAL TUNING DEVICE

Original Filed Jan. 11, 1955 2 Sheets-Sheet 1

United States Patent Office 2,910,658

Patented Oct. 27, 1959

2,910,658

HIGH-FREQUENCY WAVE-SIGNAL TUNING DEVICE

Meyer Press, Sharon, Mass., assignor to Hazeltine Research, Inc., Chicago, Ill., a corporation of Illinois Continuation of application Serial No. 484,279, January 11, 1955. This application October 9, 1958, Serial No. 766,271

4 Claims. (Cl. 333—82)

*General*

Figure 1:
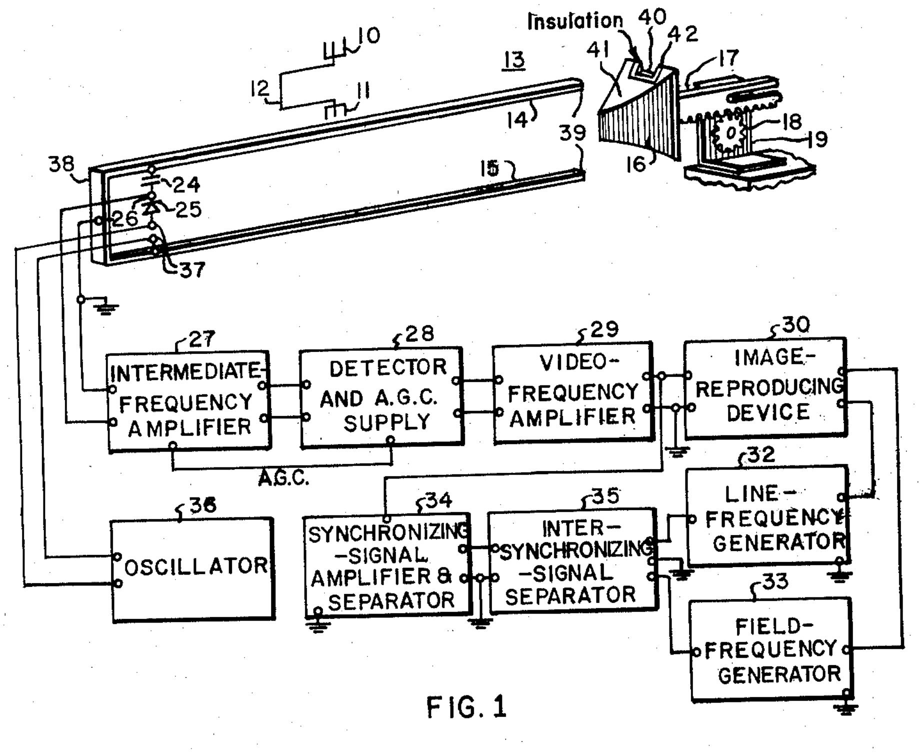

The present invention relates to improved high-frequency wave-signal tuning devices and, more particularly, to such devices which include transmission lines in which the effective electrical length of each thereof is altered by a tuning means displaceable at least along a portion of the transmission line to tune it over a selected range of wavelengths. The invention is especially directed to tuning devices which are capable of having desired tuning characteristics. Such a tuning device may have particular utility in a television receiver and, accordingly, will be described in that environment.

This application is a continuation-in-whole of application Serial No. 484,279, filed January 11, 1955, now abandoned, and entitled "High-Frequency Wave-Signal Tuning Device."

In high-frequency wave-signal receivers having tuning devices which utilize transmission lines as tuned circuits, various systems have been devised to provide desired tuning characteristics for the adjustably tuned circuits of the receivers. Some prior systems have utilized rotatable discs or plates having preselected shapes which may be inserted in controllable amounts between the conductors of the transmission lines to provide desired tuning characteristics therefor. Other systems have utilized in each thereof a tuning slug displaceable longitudinally of the transmission line and over a portion thereof having impedance continuity along the length of that portion. While these prior systems in the tuning devices have been effective to tune the transmission lines thereof, they have been somewhat unsatisfactory for some applications in that the tuning characteristics for the devices and particularly the slopes thereof may be modified only to a limited extent over the high-frequency portions of the tuning ranges.

It is an object of the present invention, therefore, to provide a new and improved high-frequency wave-signal tuning device which avoids the above-mentioned disadvantage of prior such systems.

It is another object of the invention to provide for use in a television receiver a new and improved high-frequency wave-signal tuning device which is simple in construction yet is capable of providing for the receiver a desired tuning characteristic.

It is a further object of the invention to provide for use in a television receiver an inexpensive high-frequency wave-signal tuning device which is capable of providing a high degree of control of the tuning characteristic of the receiver over the high-frequency portion of its tuning range.

In accordance with a particular form of the invention, a high-frequency wave-signal tuning device tunable over a selected frequency range comprises a transmission line having an effective electrical length approximately equal to an integral multiple of one-quarter wavelength at a predetermined frequency in the aforesaid range. The transmission line includes a pair of elongated conductors, at least one of said conductors having an attenuated end portion. The tuning device includes reactive tuning means displaceable at least along the above-mentioned portion of the conductors for primarily varying the capacitance between the tuning means and the conductors with displacement of the tuning means selectively to adjust the effective electrical length of the transmission line to substantially the aforesaid multiple of one-quarter wavelength at each frequency in the above-mentioned range to tune the transmission line in a desired manner.

For a better understanding of the present invention, together with other and further objects thereof, reference is had to the following description taken in connection with the accompanying drawings, and its scope will be pointed out in the appended claims.

Figure 2:
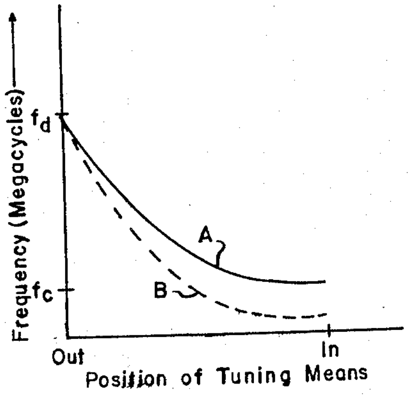
Figures 3, 4, 5:
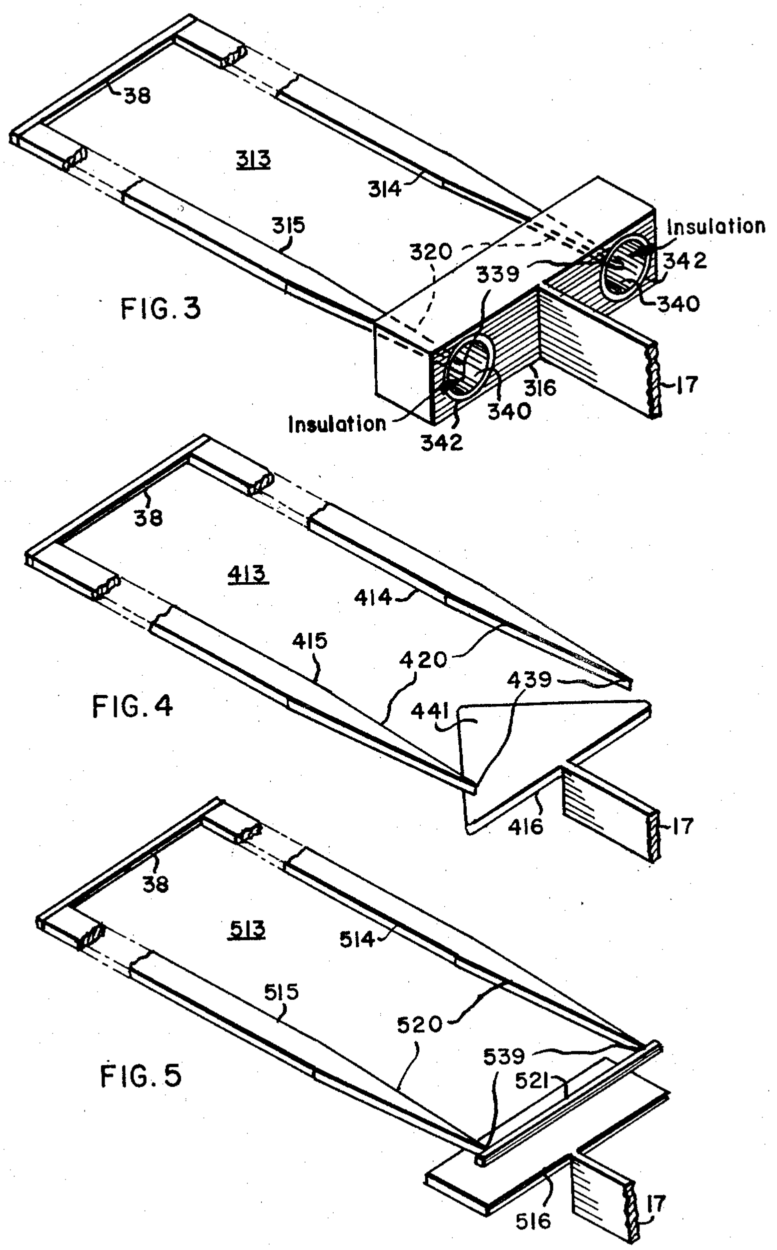

In the accompanying drawings, Fig. 1 is a circuit diagram, partly schematic, of a complete television receiver including a tuning device in accordance with a particular form of the invention. Fig. 2 is a graph utilized in explaining the operation of the tuning device of the Fig. 1 receiver. Figs. 3–5, inclusive, are fragmentary perspective views of tuning devices illustrating modifications of the invention.

Referring now more particularly to Fig. 1 of the drawings, the complete television receiver there represented comprises an antenna system 10, 11 and a coupling loop 12 coupled to a high-frequency wave-signal tuning device 13 comprising a resonant transmission line which includes conductors 14 and 15. The tuning device 13 includes a movable tuning means 16 connected to a rack 17 of insulating material. Rack 17 engages with a pinion gear 18 to provide longitudinal movement of the tuning means 16 along the transmission line comprising the conductors 14 and 15. A suitable bracket 19 supports the tuning means 16, the rack 17 and the gear 18. The tuning device 13, which embodies the present invention, will subsequently be described in greater detail.

A frequency-converter system including a condenser 24 and a crystal mixer 25 is coupled to the tuning device 13 in a conventional manner and preferably at a position on the transmission line 14, 15 selected to procure an impedance match between the transmission line 14, 15 and the frequency-converter system 24, 25. The condenser 24 is coupled through a pair of output terminals 26, 26 in cascade and in the order named to an intermediate-frequency amplifier 27 of one or more stages, a detector and automatic-gain-control or A.G.C. supply 28, a video-frequency amplifier 29 of one or more stages, and an image-reproducing device 30 which may comprise a cathode-ray tube. The A.G.C. supply circuit of unit 28 is connected to the input circuit of one or more stages of the intermediate-frequency amplifier 27 by a control circuit conductor 31.

The output circuit of the video-frequency amplifier 29 is coupled to the input circuit of a line-frequency generator 32 and a field-frequency generator 33 through a synchronizing-signal amplifier and separator 34 and an intersynchronizing-signal separator 35. The output circuits of the generators 32 and 33 are coupled in a conventional manner to scanning coils of the device 30. The television receiver also includes an oscillator 36 coupled through a pair of input terminals 37, 37 to the mixer 25. All of the described units, exclusive of the tuning device 13, may be of conventional construction and operation so that a detailed description of the operation thereof is unnecessary.

Considering briefly, however, the general operation of the above-described receiver as a whole, wave signals intercepted by the antenna system 10, 11 are translated by the coupling loop 12 and to the tuning device 13. The tuning device 13 is adjusted to resonate at the frequency of a selected wave signal by rotating the pinion gear 18 which in turn actuates the rack 17 and adjusts the position of the tuning means 16 with reference to the transmission line 14, 15. The local oscillator 36 is adjusted by suitable means (not shown) simultaneously with the adjustment of the tuning means 16 and provides for the mixer 25 at input terminals 37, 37 a heterodyne wave signal which beats with the received wave signal in the frequency-converter system 24, 25. Through the well-known heterodyne action in the frequency converter system 24, 25, an intermediate-frequency signal is applied to the input circuit of the intermediate-frequency amplifier 27. This signal in turn is selectively amplified in the intermediate-frequency amplifier 27 and delivered to the detector and automatic-gain-control supply 28. The modulation components of the signal are derived by the detector 28 and are supplied to video-frequency amplifier 29 wherein they are amplified and from which they are applied to the input circuit of the image-reproducing device 30. A control voltage derived by the automatic-gain-control supply of unit 28 is applied as an automatic-amplification-control bias to the gain-control circuits of the intermediate-frequency amplifier 27 to maintain the signal input to the detector of unit 28 within a relatively narrow range for a wide range of received signal intensities.

Unit 34 selects the synchronizing signals from the other modulation components of the composite video-frequency signal applied thereto by the video-frequency amplifier 29. The line-synchronizing and field-synchronizing signals derived by the separator 34 are separated from each other by unit 35 and are then supplied to independent ones of the generators 32 and 33 to synchronize the operation thereof. Saw-tooth current waves are generated in the generators 32 and 33 and are applied to the scanning coils of the image-reproducing device 30 thereby to deflect the cathode-ray beam of that device in two directions normal to each other to trace a rectilinear scanning pattern on the screen of the device and thereby reconstruct the translated picture.

*Description of tuning device of Fig. 1 receiver*

Referring now more particularly to the tuning device 13 which embodies the present invention the device 13, which is tunable to each of a plurality of wavelengths in a selected range of wavelengths, comprises the pair of elongated conductors 14 and 15 which are ordinarily parallel conductors having a rectangular cross-section. The conductors 14 and 15 preferably have a low-impedance termination at one end thereof provided by a conductor 38. The transmission line includes a portion 39 preferably at the other end of the conductors 14 and 15 forming a high impedance termination and presenting an impedance discontinuity. The transmission line 14, 15 has an effective electrical length approximately equal to an integral multiple, which is preferably an odd multiple, of one-quarter of a predetermined wavelength in the selected range of wavelengths. As used in this specification and the claims, the term integral multiple is employed in its usual sense and is also meant to include the product obtained by utilizing unity as a multiplication factor. The effective electrical length of the transmission line 14, 15 preferably is approximately equal to one-quarter of the shortest wavelength in the selected range.

At least one of the tuning means 16 and the pair of conductors 14 and 15 include an attenuated end portion. In the embodiment illustrated in Fig. 1, the tuning means 16 is provided with an attenuated end portion 41. The end portion 41 preferably is tapered and may have a substantially pyramid shape. This end portion is disposed longitudinally of the conductors 14 and 15 preferably with the taper thereof extending towards the end of the conductors 14 and 15 having the low-impedance termination 38. The tuning means 16 for the tuning device 13 may be made of conductive or dielectric material and has a pair of slots 40, 40 therein (only one of which may be seen) for engagement with the conductors 14 and 15. When the tuning means is made of conductive material, suitable insulating strips 42 are employed in the slots physically to separate the member 16 from the conductors 14 and 15.

The tuning means 16 is displaceable at least along the portion 39 of the transmission line 14, 15 and preferably beyond the portion 39 to a position of complete disengagement with the transmission line. The tuning means 16 presents a reactive impedance across the transmission line for selectively adjusting the effective electrical length thereof to the aforesaid multiple of one-quarter wavelength at each of the plurality of wavelengths in the selected range. Accordingly, the tuning means 16 at each position of adjustment thereof selectively adjusts the effective electrical length of the transmission line 14, 15 to one-quarter wavelength at each of the plurality of wavelengths in the selected range.

*Operation of Fig. 1 tuning device*

The operation of the tuning device represented in Fig. 1 and the results obtained thereby may be best understood by reference to Fig. 2 of the drawings. Curve A of Fig. 2, shown in solid-line construction, represents the tuning characteristic of the tuning device 13 utilizing the tuning means 16. Curve B of Fig. 2, shown in broken-line construction, represents the tuning characteristic of the tuning device 13 utilizing a tuning means which is also constructed in accordance with the invention but having an end portion with less taper than the portion 41 represented in Fig. 1.

As the tuning means 16 of Fig. 1 is moved from the position shown in that figure, which position corresponds to the one designated "Out" in Fig. 2, to a position of complete engagement with the transmission line 14, 15, which position then corresponds to the one designated "In" in Fig. 2, the resonant frequency of the transmission line decreases from a frequency $f_d$ to a frequency $f_c$, as represented by curve A of Fig. 2. The tuning means 16 may be considered as effectively introducing capacitance in the region of high electric-field intensity at the portion 39 of the conductors 14 and 15. As the tuning means 16 is displaced along the portion 39 toward conductor 38, the capacitance introduced thereby increases in a manner determined by the shape of the end portion 41 and causes an effective lengthening of the transmission line 14, 15. The resonant frequency of the transmission line is decreased by the displacement of the tuning means 16 as represented by curve A.

Considering now the effect of utilizing a tuning means in accordance with the invention but having less taper than the tuning means 16, the tuning characteristic for the device 13 is then represented by curve B as previously mentioned. It is evident that as such a tuning means is displaced at the portion 39 and toward conductor 38, the capacitance effectively introduced thereby increases more rapidly than the capacitance introduced by the tuning means 16 as described above. The effective electrical length of the transmission line 14, 15 now increases and the resonant frequency thereof now decreases more rapidly than previously, as may be seen from curve B of Fig. 2. Accordingly, over the high-frequency portion of the tuning range, the slope of the tuning characteristic represented by curve B is substantially greater than the slope of the tuning characteristic represented by curve A. Preselection of the shape of the tuning means 16 thereby provides over the high-frequency portion of the tuning range a high degree of control of the tuning characteristic of the tuning device 13. Accordingly, the tuning means 16 causes the effective electrical lengths of the transmission line 14, 15 at each position of the tuning means to alter in a desired manner.

The tuning devices of Figs. 3, 4 and 5 represent modifications of the present invention and are generally similar to that of Fig. 1, corresponding elements being designated by the same reference numerals and similar elements by similar reference numerals increased in value by the factor 300, 400, or 500, as the case may be. Each of these devices will be described in turn hereinafter.

*Description of Fig. 3 tuning device*

Referring now to Fig. 3 of the drawings, the tuning device 313 there represented comprises a transmission line having an effective electrical length approximately equal to an integral odd multiple of one-quarter of a predetermined wavelength in a selected range of wavelengths. The tuning device includes a pair of elongated conductors 314 and 315 having a low-impedance termination provided by conductor 38 at one end thereof. The transmission line 314, 315 has a portion 339 at the other end thereof having a high-impedance termination presenting an impedance discontinuity. The pair of conductors 314 and 315 has an attenuated end portion 320 adjacent the high-impedance termination. The attenuated end portion 320 of at least one of the pair of conductors 314 and 315 is tapered with the taper thereof extending toward the above-mentioned other end of the conductors having the high-impedance termination. A uniformly shaped tuning means 316, preferably of dielectric or conductive material, has a pair of bores 340 provided with insulating sleeves 342 therein for receiving the conductors 314 and 315. The tuning means 316 is displaceable at least along the attenuated end portion 320 for selectively adjusting the effective electrical length of the transmission line 314, 315 to the last-mentioned multiple of one-quarter wavelength at each of the wavelengths in the last-mentioned selected range of wavelengths. The operation of the tuning device 313 is generally similar to the operation of the tuning device 13 of the Fig. 1 embodiment and a detailed explanation thereof is deemed unnecessary. Briefly, however, adjustment of the tuning means 316 causes the effective electrical lengths of the transmission line 314, 315 at each position of adjustment of the tuning means 316 at the attenuated end portion 320 to alter in a desired manner.

*Description of Fig. 4 tuning device*

The modification of the Fig. 4 embodiment is identical with that of the Fig. 3 embodiment except for the shape and position of tuning means 416. Each of the pair of conductors 414 and 415 and the tuning means 416 includes a tapered end portion, each conductor having a tapered end portion 420 and the tuning means having a tapered end portion 441. The tapered end portions 441 and 420 are disposed longitudinally of the conductors 414 and 415 with the tapers of the tuning means 416 and the pair of conductors 414 and 415 extending in opposite directions. The tuning means 416 may be disposed below the transmission line 414, 415 to provide capacitive tuning therefor. The operation of tuning device 413 is generally similar to the operation of the tuning devices of Figs. 1 and 3 so that further explanation thereof is deemed unnecessary.

*Description of Fig. 5 tuning device*

The tuning device of Fig. 5 differs from those of the previously described figures in that the tuning device 513 utilizes a tuning means 516 of magnetic material. The tuning device 513 comprises a transmission line including a pair of elongated conductors 514 and 515. The transmission line 514, 515 also has an effective electrical length approximately equal to an integral even multiple of one-quarter of a predetermined wavelength in a selected range of wavelengths. The predetermined wavelength may be preferably the shortest wavelength in the selected range. The conductors 514 and 515 have a low-impedance termination 521 presenting an impedance discontinuity and have an attenuated end portion 520 adjacent the low-impedance termination 521. The tuning means 516 may be disposed below the transmission line 514, 515 and is displaceable at least along the attenuated end portion 520 for selectively adjusting the effective electrical length of the transmission line 514, 515 to the last-mentioned multiple of one-quarter wavelength at each of the wavelengths in the last-mentioned selected range of wavelengths.

The operation of the Fig. 5 tuning device is generally similar to the operation of the Fig. 1 embodiment. Displacement of the tuning means 516 from a region of low magnetic-field intensity into a region of high magnetic-field intensity along the attenuated end portion 520 of the conductors 514, 515 causes a gradual change in the magnetic-field distribution and lengthens the effective electrical length of the transmission line 514, 515. Inductive tuning is thereby effectively provided for the tuning device 513. Accordingly, the tuning means 516 causes the effective electrical lengths of the transmission line 514, 515 at each position of adjustment of the tuning means to alter in a desired manner.

From the foregoing description of the invention, it will be apparent that a tuning device embodying the invention has the advantage that it provides for a television receiver a tuning characteristic represented by a curve having a desired slope over the high-frequency portion of the tuning range.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A high-frequency wave-signal tuning device tunable over a selected frequency range comprising: a transmission line having an effective electrical length approximately equal to an integral odd multiple of one-quarter wavelength at a predetermined frequency in said range and including a pair of elongated conductors having a low-impedance termination at one end thereof and having at the other end thereof a high-impedance termination presenting an impedance discontinuity and having a tapered end portion adjacent said high-impedance termination with the taper thereof extending away from the low-impedance termination; and tuning means displaceable at least along said tapered end portion of said conductors for selectively adjusting the effective electrical length of said transmission line to substantially said multiple of one-quarter wavelength at each frequency in said range, said tuning means and said conductors comprising an effective condenser having a value which increases with displacements toward said one end of said conductors and providing a frequency-displacement tuning characteristic which decreases in frequency with said displacements toward said one end of said conductors to tune said transmission line in a desired manner.

2. A high-frequency wave-signal tuning device tunable over a selected frequency range comprising: a transmission line having an effective electrical length approximately equal to an integral multiple of one-quarter wavelength at a predetermined frequency in said range and including a pair of elongated conductors, at least one of said conductors having an attenuated end portion; and reactive tuning means displaceable at least along said portion of said conductors for primarily varying the capacitance between said tuning means and said conductors with displacements of said tuning means selectively to adjust the effective electrical length of said transmission line to substantially said multiple of one-quarter wavelength at each frequency in said range to tune said transmission line in a desired manner.

3. A high-frequency wave-signal tuning device tunable to each of a plurality of wavelengths in a selected range of wavelengths comprising: a transmission line having an effective electrical length approximately equal to an integral multiple of one-quarter of a predetermined wavelength in said range and including a pair of elongated conductors; and reactive tuning means of magnetic material displaceable along said transmission line for selectively adjusting the effective electrical length of said transmission line to substantially said multiple of one-quarter wavelength at said each of said plurality of wavelengths in said range; at least one of said pair of conductors including an attenuated portion disposed longitudinally of said conductors for causing said effective electrical lengths of said transmission line at each position of adjustment of said tuning means to alter in a desired manner.

4. A high-frequency wave-signal tuning device tunable to each of a plurality of wavelengths in a selected range of wavelengths comprising: a transmission line having an effective electrical length approximately equal to an integral even multiple of one-quarter of a predetermined wavelength in said range and including a pair of elongated conductors having a low-impedance termination at one end thereof and having at the other end thereof a low-impedance termination presenting an impedance discontinuity and having an attenuated end portion adjacent said low-impedance termination; and reactive tuning means of magnetic material displaceable at least along said attenuated end portion of said conductors for selectively adjusting the effective electrical length of said transmission line to substantially said multiple of one-quarter wavelength at said each of said plurality of wavelengths in said range to cause said effective electrical lengths of said transmission line at each position of adjustment of said tuning means to alter in a desired manner.

References Cited in the file of this patent

UNITED STATES PATENTS

| | | |
|---|---|---|
| 2,160,466 | Usselman | May 30, 1939 |
| 2,370,423 | Roberts | Feb. 27, 1945 |
| 2,627,579 | Wasmansdorff | Feb. 3, 1953 |
| 2,682,642 | Podolsky | June 29, 1954 |
| 2,715,211 | Murakami | Aug. 9, 1955 |